(12) United States Patent
Friedhof et al.

(10) Patent No.: US 8,092,234 B2
(45) Date of Patent: Jan. 10, 2012

(54) SYSTEM AND METHOD FOR SENSING INFORMATION THAT IS BEING COMMUNICATED THROUGH A CONNECTOR

(75) Inventors: James Friedhof, Vista, CA (US); Tom Pendleton, Sun City, CA (US)

(73) Assignee: Deutsch Engineered Connecting Devices, Inc., Hemet, CA (US)

( * ) Notice: Subject to any disclaimer, the term of this patent is extended or adjusted under 35 U.S.C. 154(b) by 0 days.

(21) Appl. No.: 12/607,907

(22) Filed: Oct. 28, 2009

(65) Prior Publication Data
US 2010/0112866 A1    May 6, 2010

Related U.S. Application Data

(60) Provisional application No. 61/109,842, filed on Oct. 30, 2008.

(51) Int. Cl.
*H01R 12/00* (2006.01)
(52) U.S. Cl. ...................................................... 439/76.1
(58) Field of Classification Search ................. 439/76.1, 439/76.2
See application file for complete search history.

(56) References Cited

U.S. PATENT DOCUMENTS

| | | | |
|---|---|---|---|
| 3,736,379 A | 5/1973 | Kagan | |
| 5,290,191 A | 3/1994 | Foreman et al. | |
| 6,031,368 A * | 2/2000 | Klippel et al. | 324/133 |
| 6,218,745 B1 * | 4/2001 | Bodin et al. | 307/104 |
| 6,937,944 B2 | 8/2005 | Furse et al. | |
| 6,938,177 B1 | 8/2005 | Blemel | |
| 7,277,822 B2 | 10/2007 | Blemel | |
| 7,503,784 B2 * | 3/2009 | Osborne et al. | 439/180 |
| 7,722,362 B2 * | 5/2010 | Frake et al. | 439/76.1 |
| 2002/0038199 A1 | 3/2002 | Blemel | |
| 2002/0045952 A1 | 4/2002 | Blemel | |
| 2005/0273217 A1 | 12/2005 | Frashure | |
| 2006/0238932 A1 | 10/2006 | Westbrock, Jr. | |
| 2008/0208532 A1 | 8/2008 | Blemel | |

FOREIGN PATENT DOCUMENTS

| | | |
|---|---|---|
| DE | 102005025541 | 12/2006 |
| EP | 1383249 | 1/2004 |

* cited by examiner

*Primary Examiner* — Truc Nguyen
(74) *Attorney, Agent, or Firm* — O'Melveny & Myers LLP

(57) ABSTRACT

A system and method is provided for sensing information (e.g., voltage, current, data, etc.) that is being transmitted through a connector. Preferred embodiments of the present invention operate in accordance with a connector and at least one sensor. In one embodiment of the present invention, the connector comprises a plug, a receptacle, and a sensor assembly for housing at least one circuit board, at least one sensor, and at least one sensor housing, wherein the sensor is configured to sense (or sample) information that is being communicated over a conductor. The sensor may be a torroidal coil that includes a core (e.g., ferrite, etc.) and at least one wire (e.g., copper, etc.) wound around the core. Alternatively, the sensor may be a MEMS sensor, a Hall Effect sensor, a capacitive sensor, a resistive sensor and/or a direct (or physical) connection between the at least one wire and either the at least one circuit board or an external circuit. In one embodiment of the present invention, the at least one circuit board may include circuitry for storing, processing and transmitting the sensed information.

25 Claims, 15 Drawing Sheets

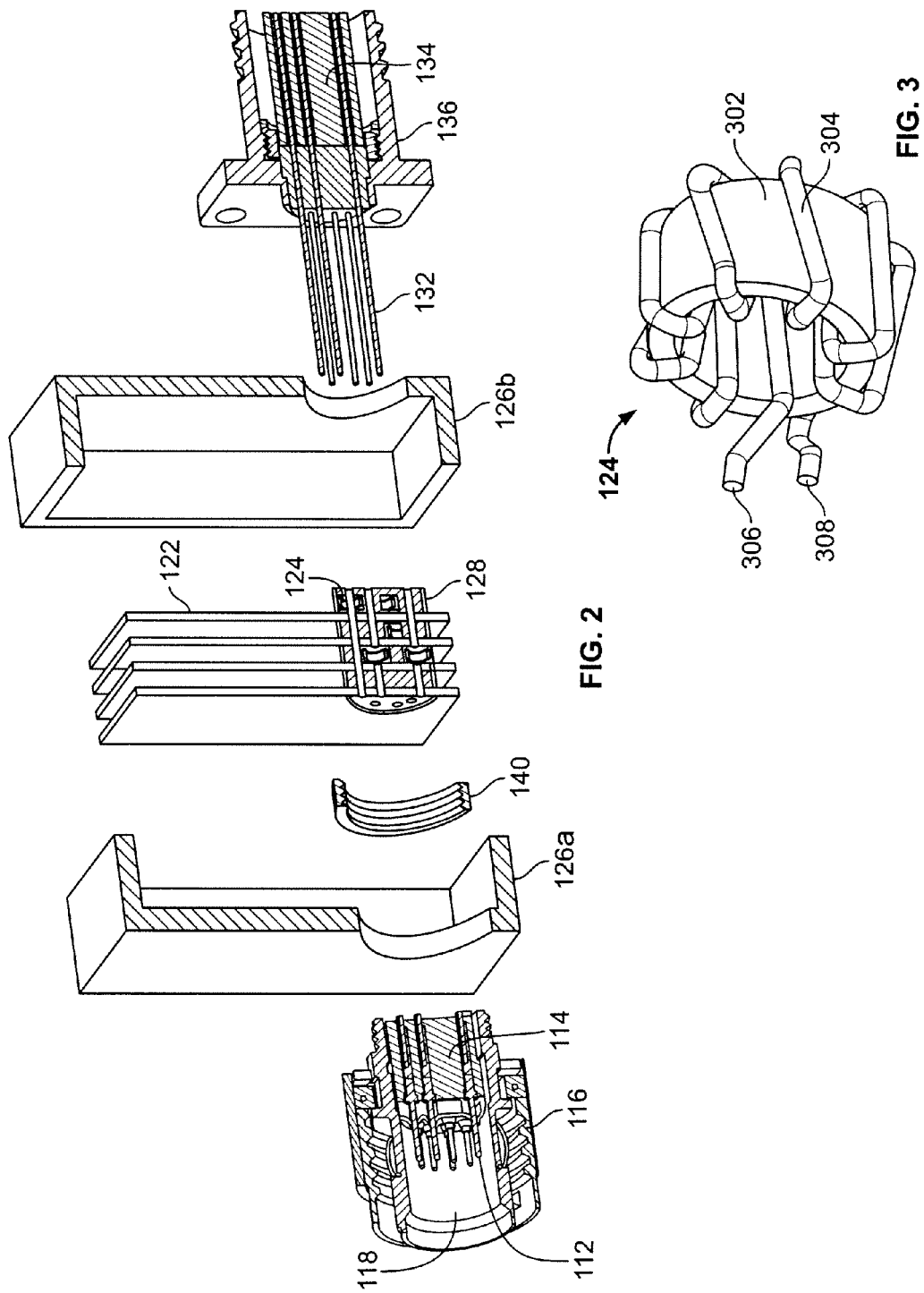

SYSTEM AND METHOD FOR SENSING INFORMATION THAT IS BEING COMMUNICATED THROUGH A CONNECTOR

CROSS-REFERENCE TO RELATED APPLICATION

This application claims benefit pursuant to 35 U.S.C. §119 (e) of U.S. Provisional Application No. 61/109,842 filed Oct. 30, 2008, which application is specifically incorporated herein, in its entirety, by reference.

BACKGROUND OF THE INVENTION

1. Field of the Invention

The present invention relates to a connector or, more particularly, to a connector (e.g., in-line connector, plug, receptacle, etc.) with (i) at least one sensor for sensing information that is being communicated on at least one conductor and/or (ii) at least one circuit for processing, storing and/or transmitting said information and/or a resultant thereof.

2. Description of Related Art

Connectors are used in many applications, including commercial, consumer and military applications. Connectors are typically used to transmit information (e.g., a voltage, current, etc.) from a first device to a second device. For example, a connector may be used to provide power from a power supply to a circuit. By way of another example, a connector may be used to provide analog and/or digital information from a first circuit to a second circuit. There are times, however, when a device in communication with a connector is either malfunctioning or needs to be monitored. Traditionally, this is done using a multi-meter (e.g., volt meter, ohm meter, etc.) or an oscilloscope.

There are several drawbacks, however, of using a multi-meter or an oscilloscope to measure and/or monitor a device. For example, it may be difficult to physically place a probe of the multi-meter on a conductor (or lead) of the device if the conductor is either too small, closely located to another conductor, or located in a concealed environment. Further, a user may have to hold the probe on the conductor, thereby preventing the user from performing other tasks. Such a system can also make it difficult for the device to be monitored over an extended period of time. There is even a chance that the multi-meter, itself, can alter or effect the signal that is being measured, thereby resulting in a false measurement.

Thus, it would be advantageous to provide a system and method that overcomes at least some of the foregoing drawbacks.

SUMMARY OF THE INVENTION

The present invention provides a system and method for sensing information (e.g., voltage, current, data, etc.) that is being transmitted through a commercial, consumer or military connector. Preferred embodiments of the present invention operate in accordance with a connector (e.g., an in-line connector, plug, receptacle, etc.) and at least one sensor.

In a first embodiment of the present invention, the connector comprises a plug, a receptacle, and a sensor assembly for housing at least one circuit board, at least one sensor, and at least one sensor housing, wherein the sensor is configured to sense (or sample) information that is being communicated over a conductor.

The plug of the present invention may include at least an outer shell, an inner shell, a pin assembly and at least one pin contact, wherein the outer shell may be configured for connection to a corresponding receptacle. The receptacle of the present invention may include a shell, a socket assembly, and at least one socket contact, wherein the shell may be configured for connection with a corresponding plug. In one embodiment of the present invention, the corresponding receptacle and plug are, respectively, receptacle and plug portions of the foregoing commercial, consumer or military connector.

In one embodiment of the present invention, the sensor is a torroidal coil, and includes a core (e.g., ferrite, etc.) and at least one wire (e.g., copper, etc.), wherein the wire is wound a plurality of times around the core. Such a sensor can be used to sense (or sample) information that is being communicated over a conductor by placing the conductor inside the sensor. The information can then be transmitted to an internal and/or external circuit. In alternate embodiments of the present invention, the sensor is a MEMS sensor, a Hall Effect sensor, an inductive sensor, a capacitive sensor, a resistive sensor and/or a direct (or physical) connection between the conductor and the internal and/or external circuit.

In one embodiment of the present invention, the sensor is attached to a sensor housing, which in turn is connected to a circuit board. The circuit board may further include, for example, circuitry for storing, processing and transmitting the sensed information. For example, the circuitry may include a processor for processing the sensed information, a memory for storing the sensed information, and/or a communication port (e.g., serial communication port, Bluetooth transceiver, WiFi transceiver, etc.) for transmitting (either wirelessly or via a wire) the sensed information (or a resultant thereof) to an external device. In alternate embodiments of the present invention, the sensor is located in a plug, a receptacle and/or a backshell configured to be connected to a plug and/or a receptacle.

A more complete understanding of a system and method for sensing information that is communicated over a conductor will be afforded to those skilled in the art, as well as a realization of additional advantages and objects thereof, by a consideration of the following detailed description of the preferred embodiment. Reference will be made to the appended sheets of drawings, which will first be described briefly.

BRIEF DESCRIPTION OF THE DRAWINGS

FIG. 2 is an exploded view of the sensor connector illustrated in FIG. 1;

FIG. 3 illustrates a sensor in accordance with one embodiment of the present invention;

DETAILED DESCRIPTION OF THE PREFERRED EMBODIMENT

The present invention provides a sensor connector for at least sensing information (e.g., voltage, current, data, etc.) that is being transmitted through a commercial, consumer or military connector. In the detailed description that follows, like element numerals are used to describe like elements illustrated in one or more figures.

Figure 1:
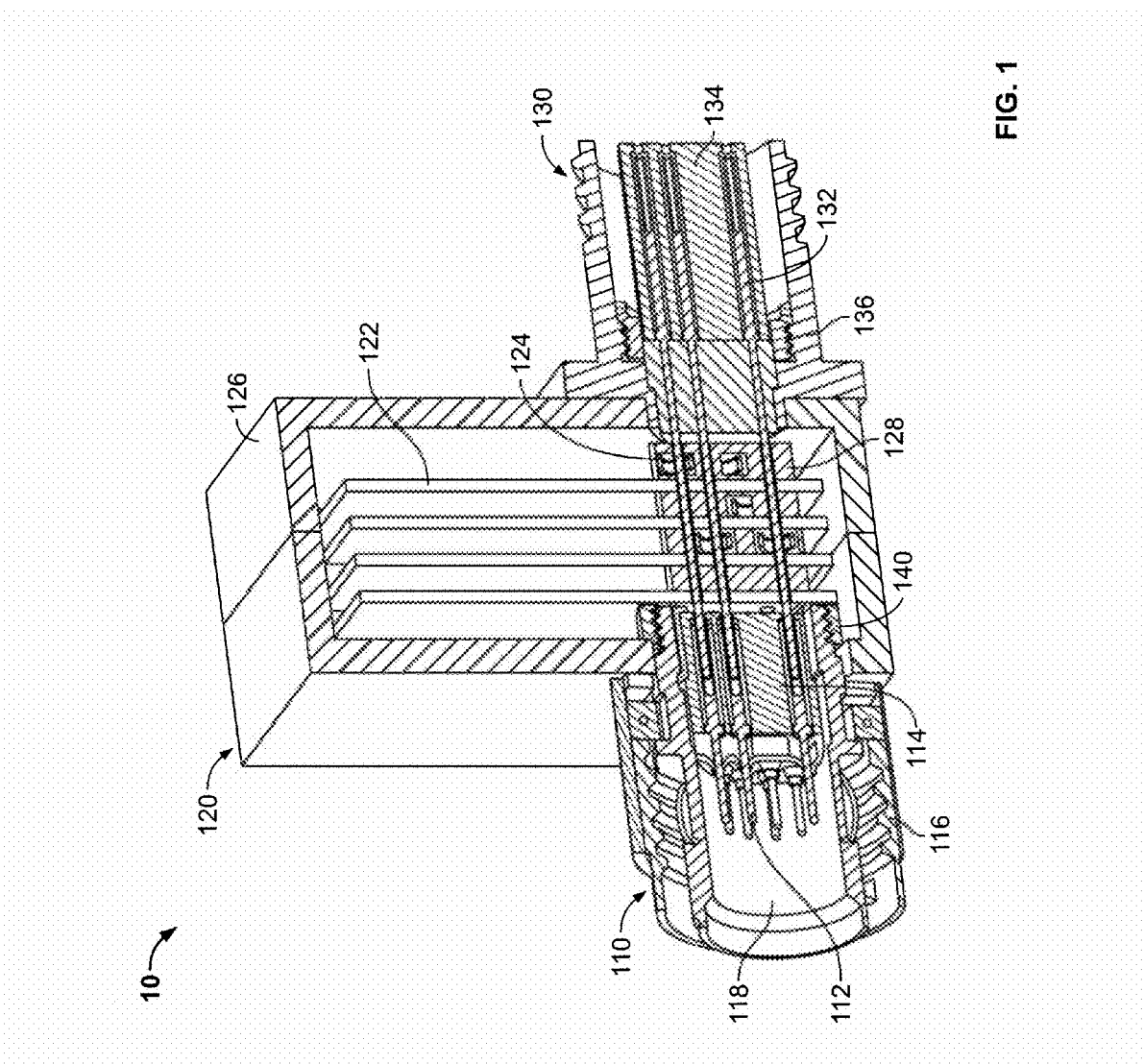
FIG. 1 illustrates a sensor connector in accordance with one embodiment of the present invention, comprising a plug, a receptacle, a circuit board housing a plurality of circuit boards, a plurality of sensor housings, and a plurality of sensors.

A sensor connector in accordance with one embodiment of the present invention is shown in FIG. 1. Specifically, the connector 10 includes a plug 110, a receptacle 130, and a sensor assembly 120 for housing at least one circuit board 122, at least one sensor 124, and at least one sensor housing 128, wherein the sensor 124 is configured to sense (or sample) information that is being communicated over a conductor. The plug 110 may include an outer shell 116, an inner shell 118, a pin assembly 114 and at least one pin contact 112, wherein the pin assembly 114 is configured to retain the pin contact 112, the inner shell 118 is configured to retain the pin assembly 114, and the outer shell 116 is configured to retain the inner shell 118, and for connection with a corresponding receptacle. It should be appreciated, however, that the present invention is not limited to a sensor having a plug as shown in FIG. 1. Thus, for example, a connector having a plug (or the like) that includes fewer or additional components is within the spirit and scope of the present invention.

The receptacle 130 may include a shell 136, a socket assembly 134, and at least one socket contact 132, wherein the socket assembly 134 is configured to retain the socket contact 132, and the shell 136 is configured to retain the socket assembly 134, and for connection with a corresponding plug. It should be appreciated that, but for the sensor connector 10, the corresponding plug may be connected to the above-mentioned corresponding receptacle. It should further be appreciated that the present invention is not limited to a connector having a receptacle as shown in FIG. 1. Thus, for example, a connector having a receptacle (or the like) that includes fewer or additional components is within the spirit and scope of the present invention. By way of example only, FIG. 2 shows the socket contact 132 as being an extended socket contact, or a socket contact that is long enough so that it extends through a corresponding sensor. It is within the spirit and scope of the present invention, however, for the connector to use either (i) an extended pin contact or (ii) an intermediary contact (or conductor) that is connected to a standard pin contact and/or a standard socket contact (e.g., via an adapter, wires, etc.).

The sensor assembly 120 may include an outer housing 126 that is configured to retain at least one circuit board 122. The outer housing 126, as shown in FIG. 2, may include a left portion 126a and a right portion 126b, wherein the left portion 126a is configured for connection with the right portion 126b (e.g., via screws, etc.). It should be appreciated, however, that the present invention is not limited to a connector having a sensor assembly as shown in FIGS. 1 and 2. Thus, for example, a connector having a sensor assembly (or the like) that includes fewer components (e.g., a unitary design, etc.) or additional components (e.g., at least one connector for communicating sensed information to an external device, etc.) is within the spirit and scope of the present invention.

A sensor in accordance with one embodiment of the present invention is illustrated in FIG. 3. Specifically, the sensor 124, which is commonly known as a torroidal coil, includes a core 302 (e.g., ferrite, etc.) and at least one wire 304 (e.g., copper, etc.), wherein the wire 304 is wound a plurality of times around the core 302 and includes a first end 306 and a second end 308. Such a sensor can be used to sense (or sample) information that is being communicated over a conductor by placing the conductor inside the sensor. The information can then be transmitted to an internal and/or external circuit via the first and/or second ends. It should be appreciated, however, that the present invention is not limited to the sensor shown in FIG. 3, and includes all types of sensors generally known to those skilled in the art. For example, a sensor connector comprising one or more Micro-Electromechanical System (MEMS) sensor, Hall Effect sensor, inductive sensor (e.g., current sensing transformer, etc.), capacitive sensor (e.g., metal tube capacitor, etc.) and/or resistive sensor (e.g., sense resistor, etc.) is within the spirit and scope of the present invention. It is also within the spirit and scope of the present invention to provide at least one direct (or physical) connection between the conductor and, for example, an internal and/or external circuit.

Figure 4:
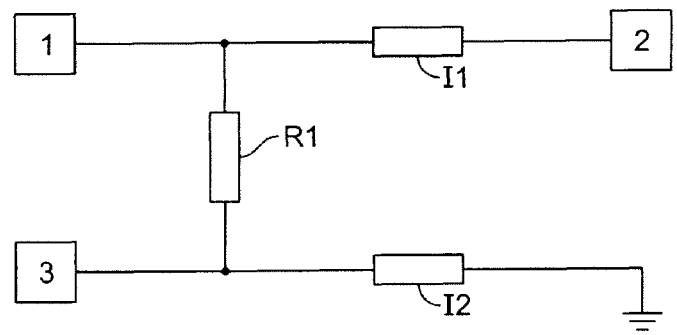
FIG. 4 is an exemplary circuit diagram for the sensor illustrated in FIG. 3.

FIG. 4 provides an exemplary circuit diagram for the sensor illustrated in FIG. 3, wherein the diagram includes a first port 1 at a first end of the conductor, a second port 2 at a second end of the conductor, and a third port 3 at an output of the sensor. For purposes of simulation, the resistance between ports 1 and 2 is 183 ohms, representing a 22 AWG wire 3 mm over a ground plane, the resistance at port 3 is 50 ohms, representing a resistor R1 in series with the coil, the self inductance of the wire (i.e., l1) is L, the self inductance of the coil (i.e., l2) is M, and the coupling coefficient of the inductors is k.

The self inductance of the wire (i.e., L) can be calculated from the following formula, where $\mu_o$ is the permeability of space at $4\pi \times 10^{-7}$ H/m, $\mu_r$ is the relative permeability at 5000, c is the height of the core, d is half the outside diameter of the core, and b is half the inside diameter of the core:

$$L = \frac{\mu_o \mu_r c}{2\pi} \ln\frac{d}{b} = \frac{(4\pi \times 10^{-7} \text{ H/m})(5000)(2.54 \times 10^{-3} \text{ m})}{2\pi} \ln\frac{.00197 \text{ m}}{.00112 \text{ m}}$$

$$L = 1.4343 \times 10^{-6} \text{ H}$$

The self inductance of the coil (i.e., M) can be calculated from the following formula, where N is the number of turns at 9, $\mu_o$ is the permeability of space at $4\pi \times 10^{-7}$ H/m, $\mu_r$ is the relative permeability at 5000, c is the height of the core, d is half the outside diameter of the core, and b is half the inside diameter of the core:

$$M = \frac{N^2 \mu_o \mu_r c}{2\pi} \ln\frac{d}{b}$$
$$= \frac{(9)^2(4\pi \times 10^{-7} \text{ H/m})(5000)(2.54 \times 10^{-3} \text{ m})}{2\pi} \ln\frac{.00197 \text{ m}}{.00112 \text{ m}}$$

$$M = 1.162 \times 10^{-4} \text{ H}$$

Figure 5:
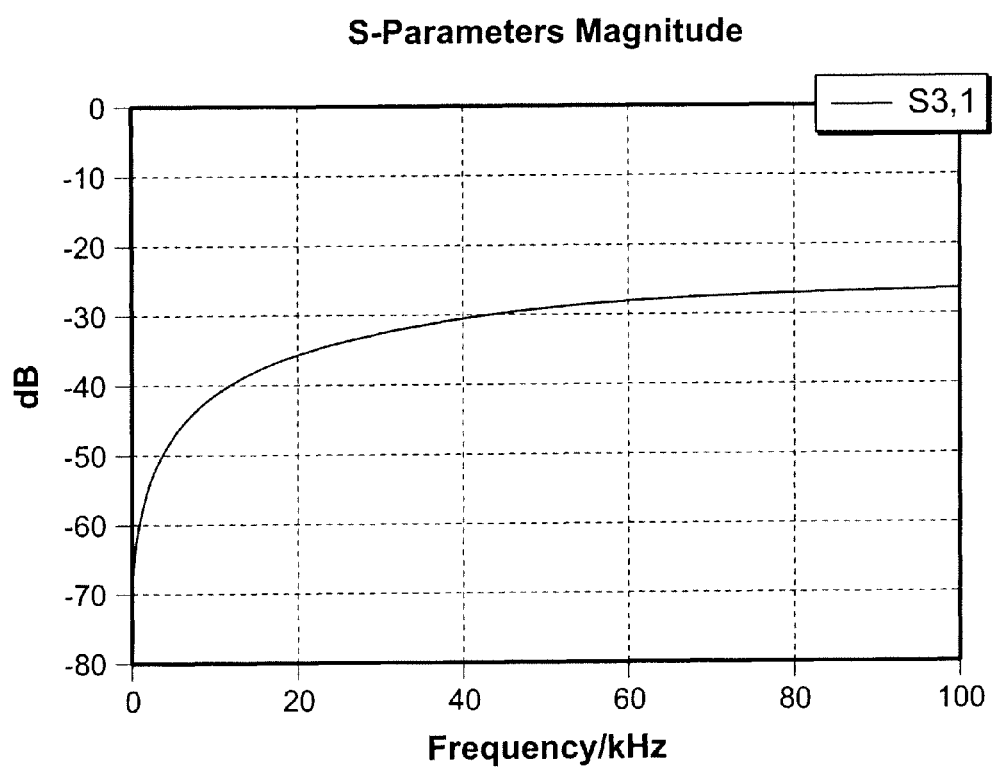
FIG. 5 provides simulation results of the circuit diagram provided in FIG. 4 over a frequency range of 0 Hz (i.e., DC voltage) to 100 kHz.

Simulated results for FIG. 4, S3,1 are provided in FIG. 5. As shown therein, a power loss of 26 dB occurs at 100 kHz. By way of example, a 1 W signal going into the sensor (at port 1), will result in a 0.002512 W coming out (at port 3). By way of another example, a 13.5 V signal going into the sensor, will result in a 0.354 V signal coming out. FIG. 5 further illustrates that there is no power transmission at DC to the coil. While this type of sensor could be used to sense any signal, it would work especially well on signals with frequencies over 20 kHz.

Figure 6:
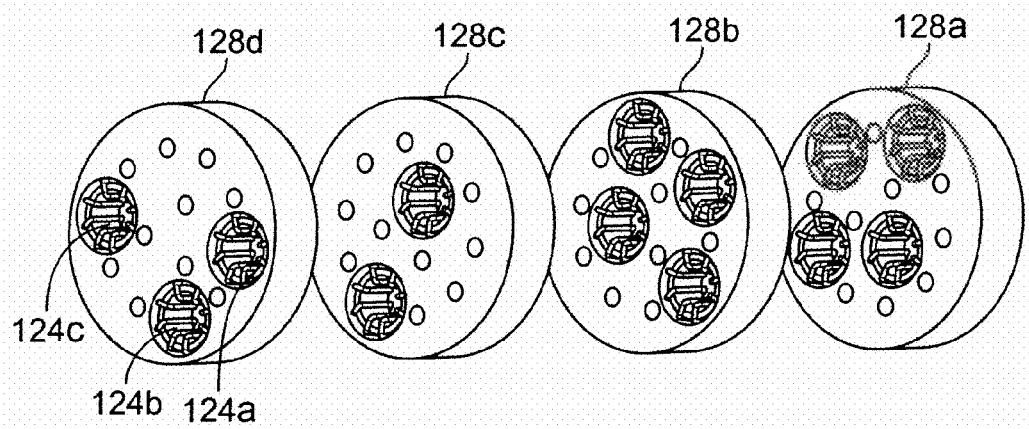
FIG. 6 illustrates a sensor housing in accordance with one embodiment of the present invention.

A plurality of sensor housings are shown in FIG. 6, wherein each sensor housing (e.g., 128d) includes a plurality of sensors (e.g., 124a-c). The sensors shown in FIG. 6 are spaced over a plurality of sensor housings (e.g., 128a-d) because the diameter of each sensor shown is larger than the distance between adjacent conductors. It should be appreciated, however, that a connector of the present invention may not include the sensor housings shown in FIG. 6. For example, a connector that includes fewer sensor housings (e.g., by placing all sensors on a single sensor housing, etc.), additional sensor housings, or does not include a sensor housing (e.g., where the sensors are mounted directly on a circuit board, etc.) is within the spirit and scope of the present invention.

Figure 7:
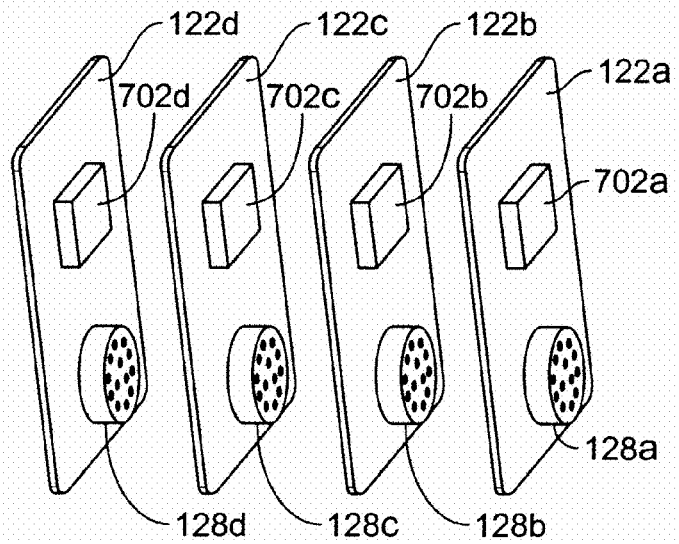
FIG. 7 illustrates a circuit board in accordance with one embodiment of the present invention.

A plurality of circuit boards are shown in FIG. 7, wherein each circuit board (e.g., 122d) includes a sensor housing (e.g., 128d) and a circuit (e.g., 702d). As shown in FIG. 6, the sensor housing (e.g., 128d) includes a plurality of sensors, which are in communication with the circuit (e.g., 702d). The circuit, which may includes a single circuit or a plurality of circuits in communication with each other, is configured to process, store and/or transmit information sensed by the sensors. For example, the circuit may include a processor for processing the information sensed by the sensors, a memory for storing information sensed by the sensors, and/or a communication port (e.g., serial communication port, Bluetooth transceiver, WiFi transceiver, etc.) for transmitting (either wirelessly or via a wire) the information sensed by the sensors (or a resultant thereof) to an external device. It should be appreciated, however, that a connector of the present invention may not include the circuit boards shown in FIG. 7. For example, a connector that includes fewer circuit boards, additional circuit boards, or does not include a circuit board (e.g., where the sensor housing is wired directly to a connector in communication with an external device, etc.) is within the spirit and scope of the present invention. It should further be appreciated that the present invention in not limited to any particular type of circuit board. For example, a circuit board that includes at least one substrate (e.g., plastic, liquid crystal polymer (LCP), etc.) and/or at least one electrically conductive path (e.g., copper, nickel, silver, gold, tin, etc.) is within the spirit and scope of the present invention.

Figure 8:
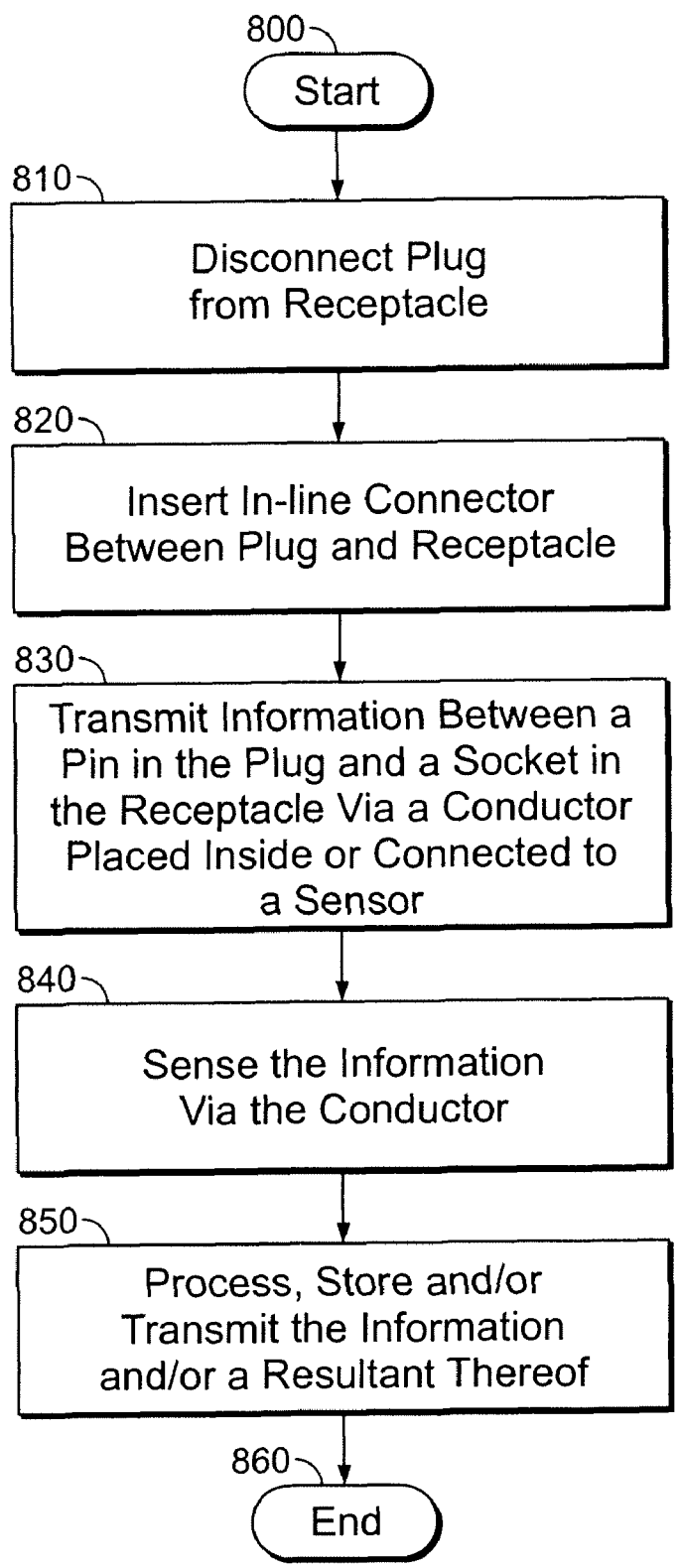
FIG. 8 illustrates a method of using an in-line sensor connector for sensing information that is being communicated over a conductor (e.g., pin contact, socket contact, wire, etc.) in accordance with one embodiment of the present invention.

FIG. 8 provides a method for using an in-line sensor for sensing (or sampling) information that is communicated over a conductor. Specifically, starting at step 800, a commercial, consumer or military plug and receptacle are disconnected at step 810. The in-line connector is then inserted between the plug and the receptacle at step 820. Information is then communicated between a pin of the plug and a socket of the receptacle via a conductor that is placed inside or connected to a sensor at step 830. In a preferred embodiment of the present invention, the sensor includes an inductive sensor (e.g., torroidal coil, etc.), a MEMS sensor, a Hall Effect sensor, a capacitive sensor and/or a resistive sensor. At step 840, the information that is being communicated over the conductor is then sensed (or sampled). It should be appreciated, however, that the sensed information may only be a portion of the information that is being communicated over the conductor. At step 850, the sensed information is then processed, stored, and/or transmitted to an external device. For example, the information may be stored (e.g., in a memory) and/or processed (e.g., by a processor), and a resultant thereof (e.g., as processed) may be transmitted to an external device (e.g., via a wireless or wired communication port).

Figure 9:
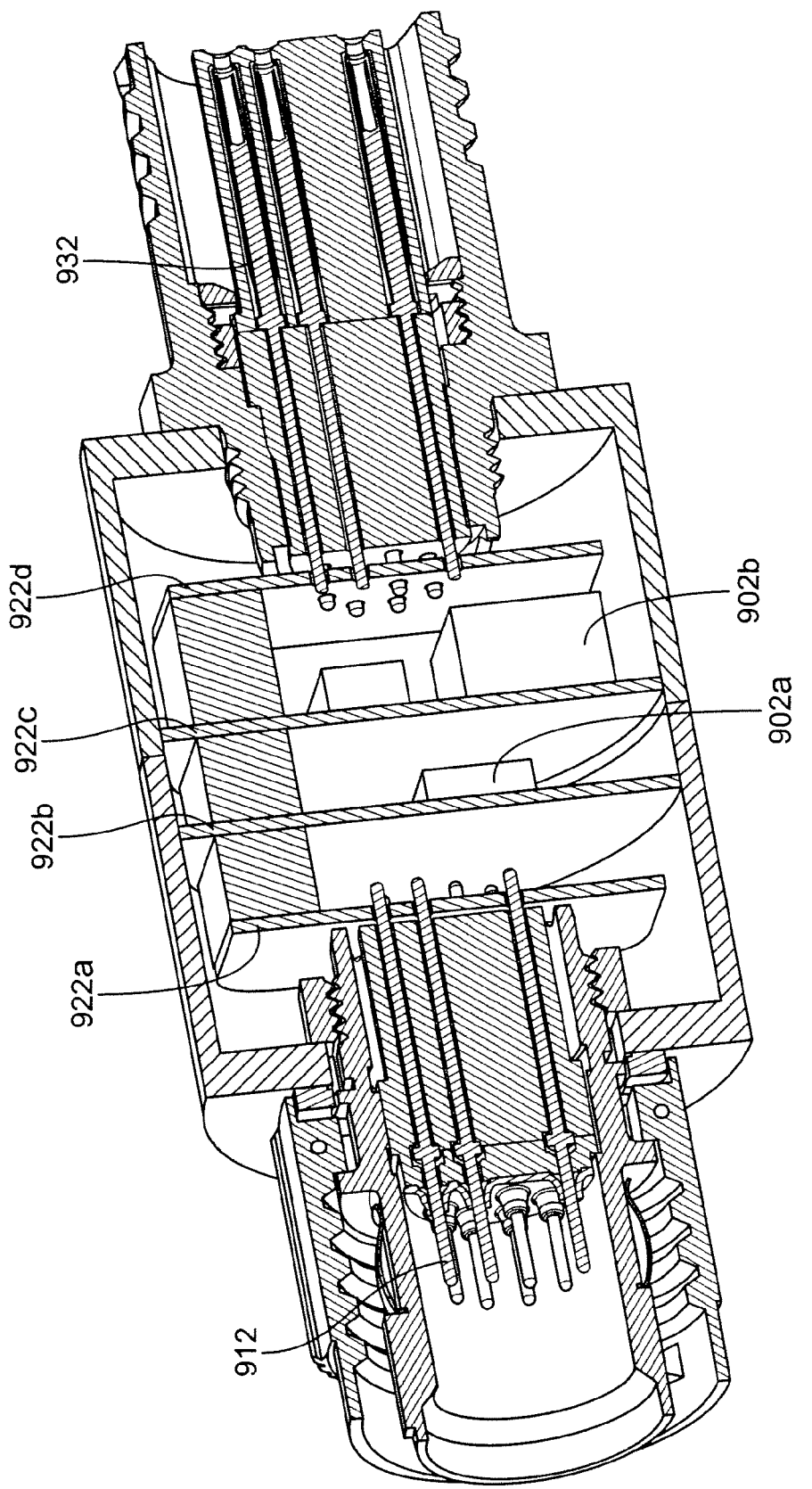
FIG. 9 illustrates a sensor connector in accordance with a second embodiment of the present invention.

A sensor connector in accordance with a second embodiment of the present invention is shown FIG. 9. The connector illustrated in FIG. 9 is similar to the one illustrated in FIG. 1 in that it includes a plug having at least one pin contact 912, a receptacle having at least one socket contact 932, and a sensor assembly having at least one circuit board (e.g., 922a-d). The connector illustrated in FIG. 9, however, differs from the one illustrated in FIG. 1 in that the socket contact does not travel through a sensor disposed in the circuit board. Instead, pin and socket contacts 912, 932 are physically connected to circuit boards 922a, 922d, and electrically connected to (at least a portion of) circuits 902a, 902b. Circuits 902a, 902b are used (at least in part) to sense information communicated between the socket and pin contacts, process the information, store the information (or a resultant thereof), and/or transmit the information (or a resultant thereof). For example, the circuit boards may include at least one electrical path (e.g., copper traces, wires, etc.) for routing information between the pin and socket contacts. Further, the circuits may include at least one MEMS sensor, Hall Effect sensor, inductive sensor, capacitive sensor and/or resistive sensor for sensing the information. The sensed information can then be processed, stored and/or transmitted (e.g., to an internal and/or external device).

Figure 10:
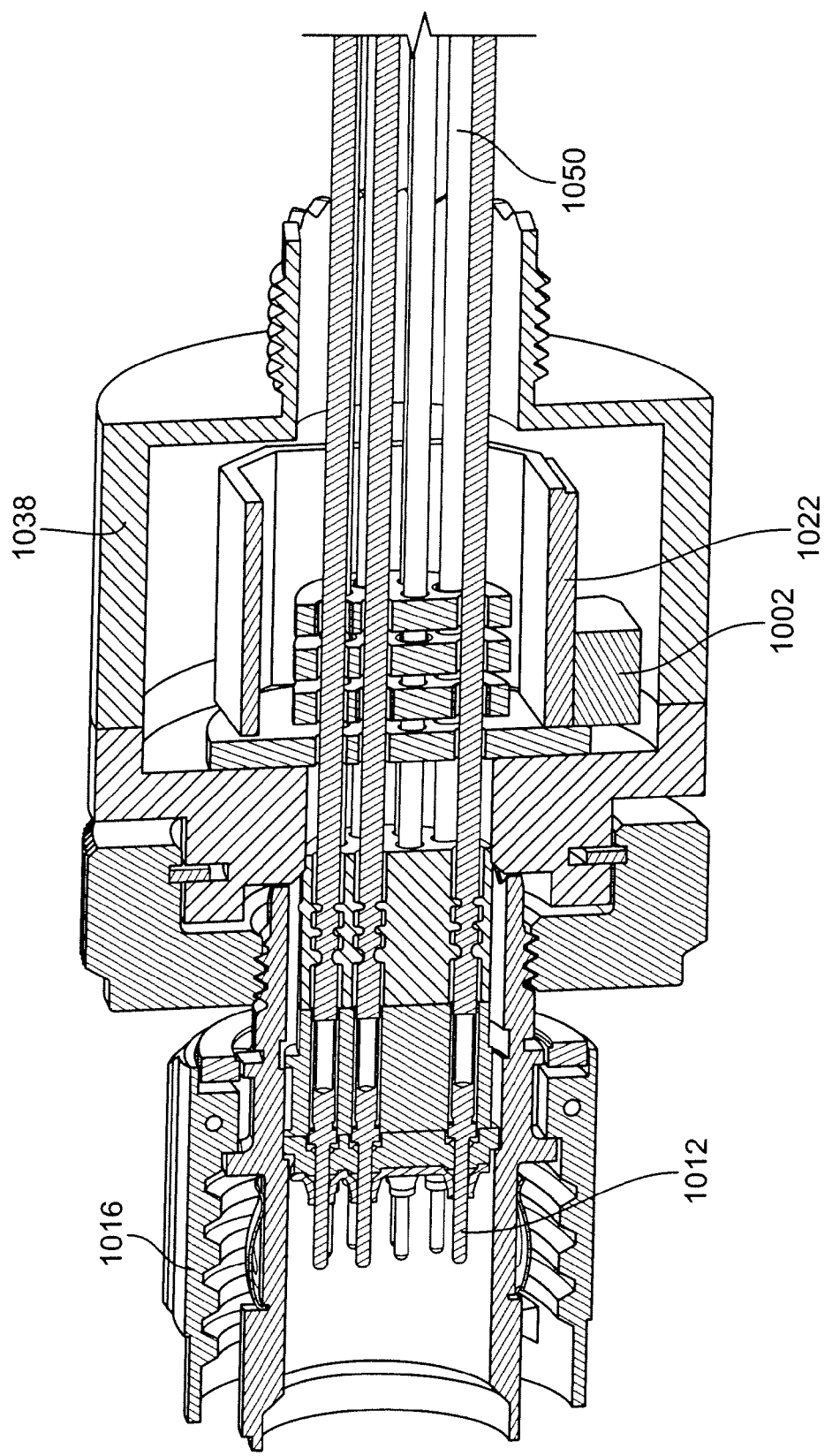
FIG. 10 illustrates a sensor connector in accordance with a third embodiment of the present invention.

A sensor connector in accordance with a third embodiment of the present invention is shown in FIG. 10. The primary difference between the connector illustrated in FIG. 10 and the one illustrated in FIG. 1 is that the sensor is located in a backshell portion of a connector. Specifically, a wire 1050 is routed through a sensor (e.g., an inductive sensor, a capacitive sensor, etc.) that is in communication with a flexible circuit board 1022 and located inside a backshell 1038. The wire 1050 is then connected to a pin contact 1012, and the backshell 1038 is connected (e.g., via threads, etc.) to a plug 1016. This allows information transmitted over the wire 1050 to be sensed by the sensor and processed, stored and/or transmitted by a circuit 1002. By placing the sensor assembly in a backshell, the sensor assembly can be connected to a standard plug or receptacle, and used without requiring a special in-line connector.

Figure 11:
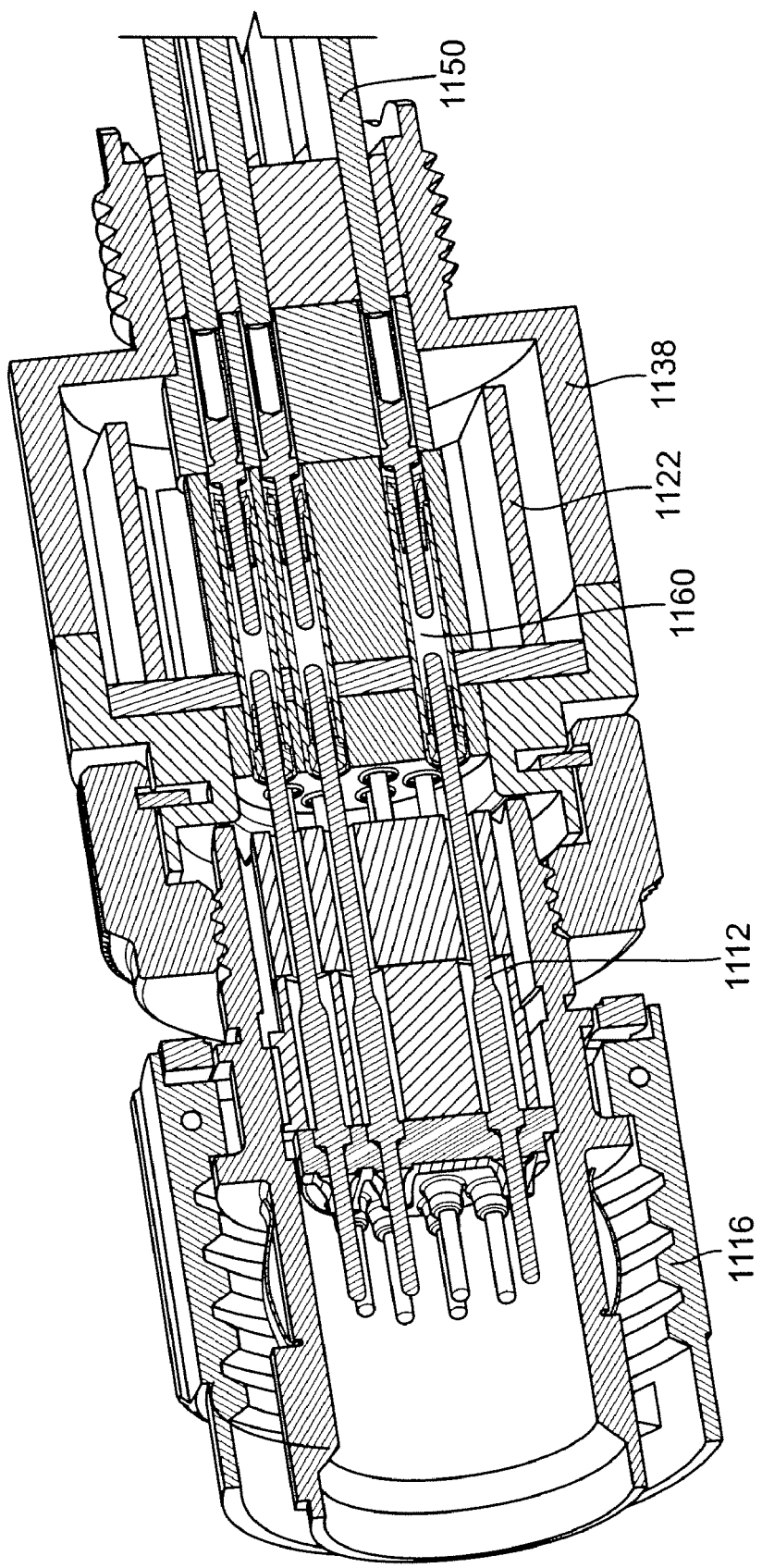
FIG. 11 illustrates a sensor connector in accordance with a fourth embodiment of the present invention.

A sensor connector in accordance with a fourth embodiment of the present invention is shown in FIG. 11. The primary difference between the connector illustrated in FIG. 11 and the one illustrated in FIG. 10 is that the wire does not travel through a sensor, but is physically connected to the sensor via a double-ended socket. Specifically, the connector includes a plug 1116 and at least one pin contact 1112. The connector further includes a backshell 1138, which includes a flexible circuit board 1122, at least one double-ended socket 1160, and at least one sensor (e.g., inductive sensor, capacitive sensor, resistive sensor, etc.). In a preferred embodiment of the present invention, the backshell 1138 is connected (e.g., via threads, etc.) to the plug 1116, and the double-ended socket 1160 is connected to the pin contact 1112, a wire 1150 and the sensor. By doing this, information can be communicated between the wire 1150 and the pin contact 1112, and sensed by the sensor.

Figure 12:
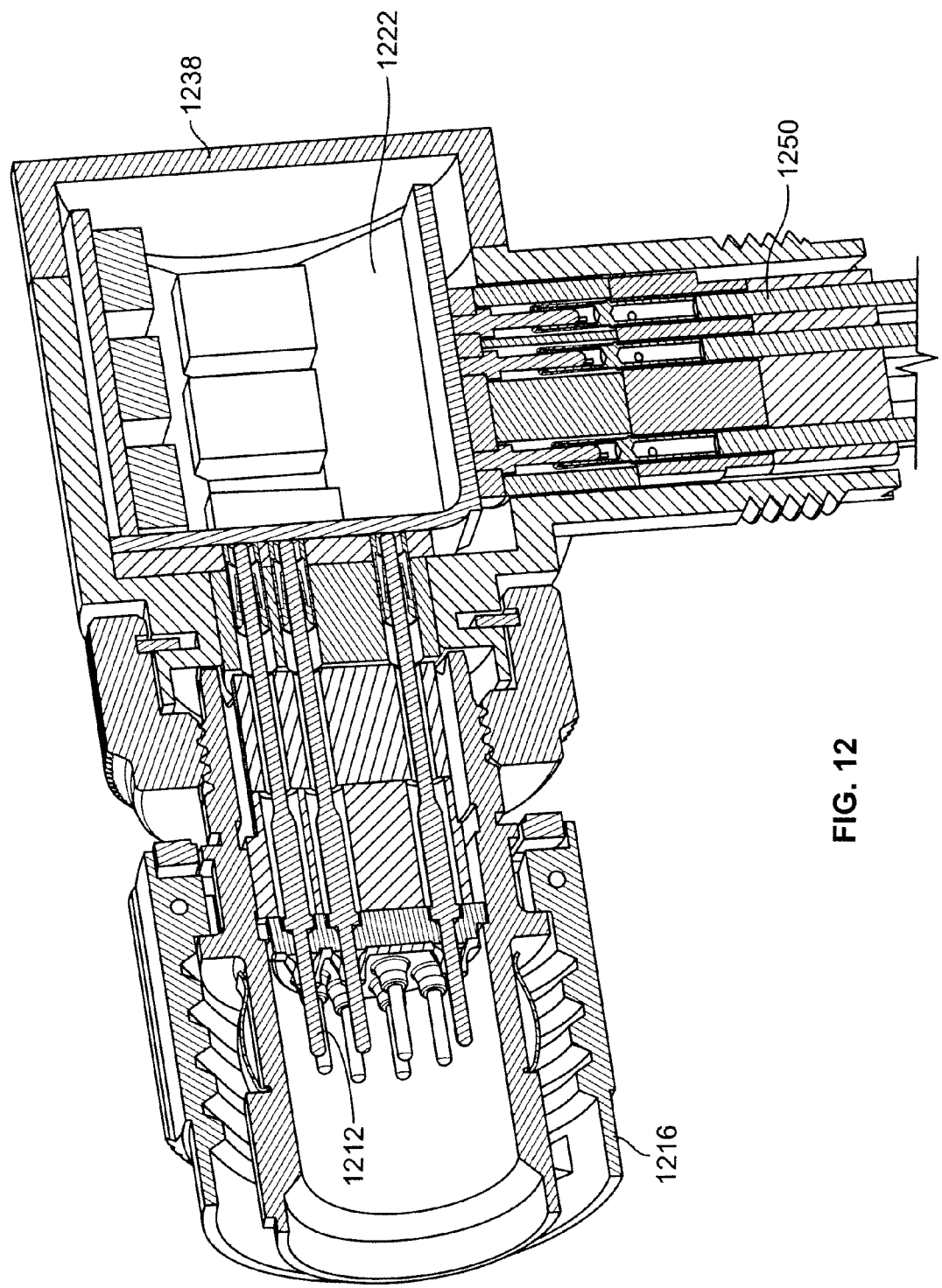
FIG. 12 illustrates a sensor connector in accordance with a fifth embodiment of the present invention.

A sensor connector in accordance with a fifth embodiment of the present invention is shown in FIG. 12. The primary difference between the connector illustrated in FIG. 12 and the one illustrated in FIG. 11 is that the backshell is a 90° backshell 1138, and a rigid-flex circuit board 1222 is used to connect a wire 1250 to a pin contact 1212. Other than this, the sensor connector functions as previously described.

Figure 13:
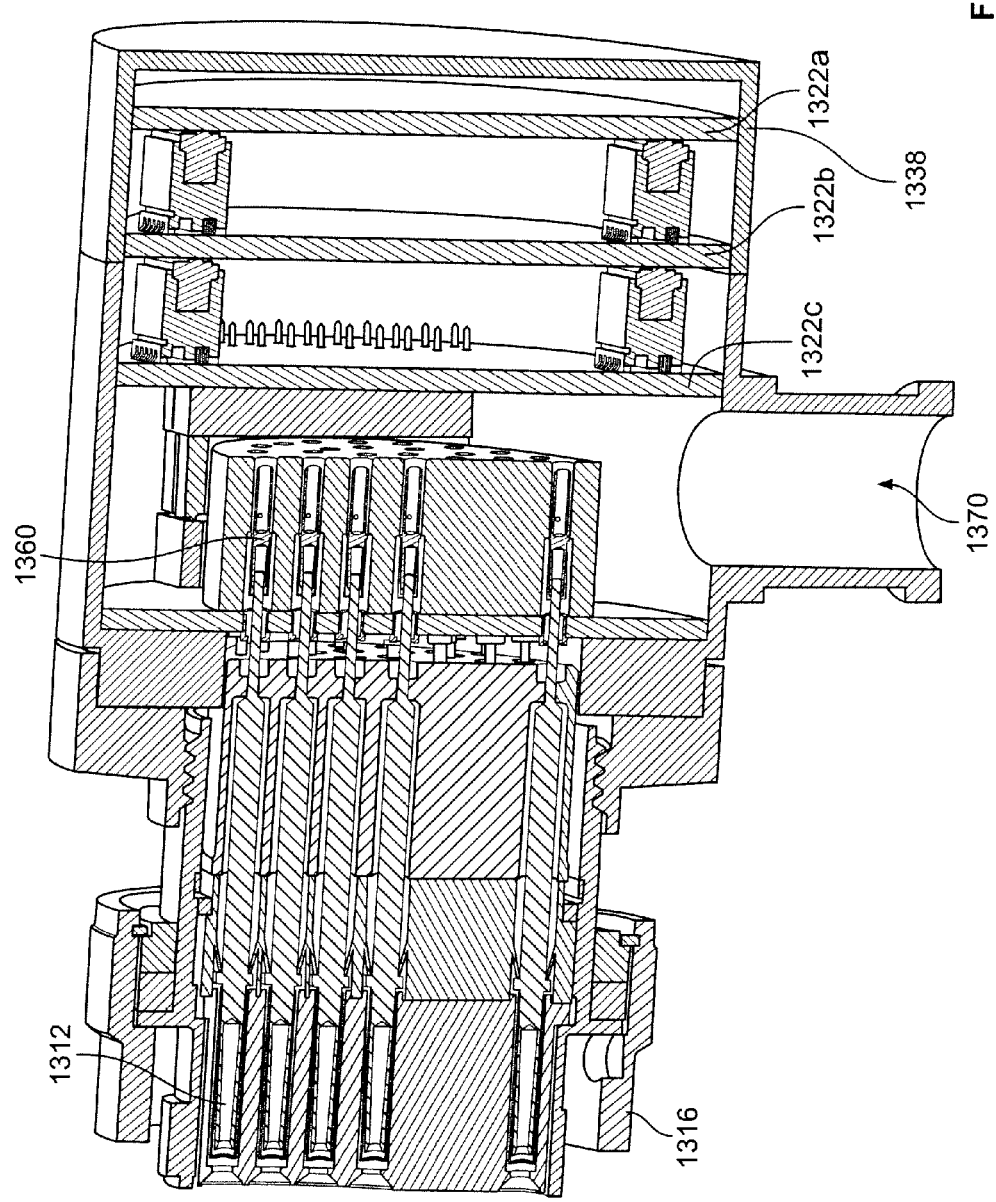
FIG. 13 illustrates a sensor connector in accordance with a sixth embodiment of the present invention.

A sensor connector in accordance with a sixth embodiment of the present invention is shown in FIG. 13. The primary difference between the connector illustrated in FIG. 13 and the one illustrated in FIG. 12 is that the backshell 1338 includes rigid circuit boards (e.g., 1322a-c) (as oppose to a rigid-flex circuit board). The connector also includes a socket 1360 that is directly connected to a pin contact 1312 and adapted to receive a wire (not shown). Other than this, the sensor connector functions as previously described.

Figure 14:
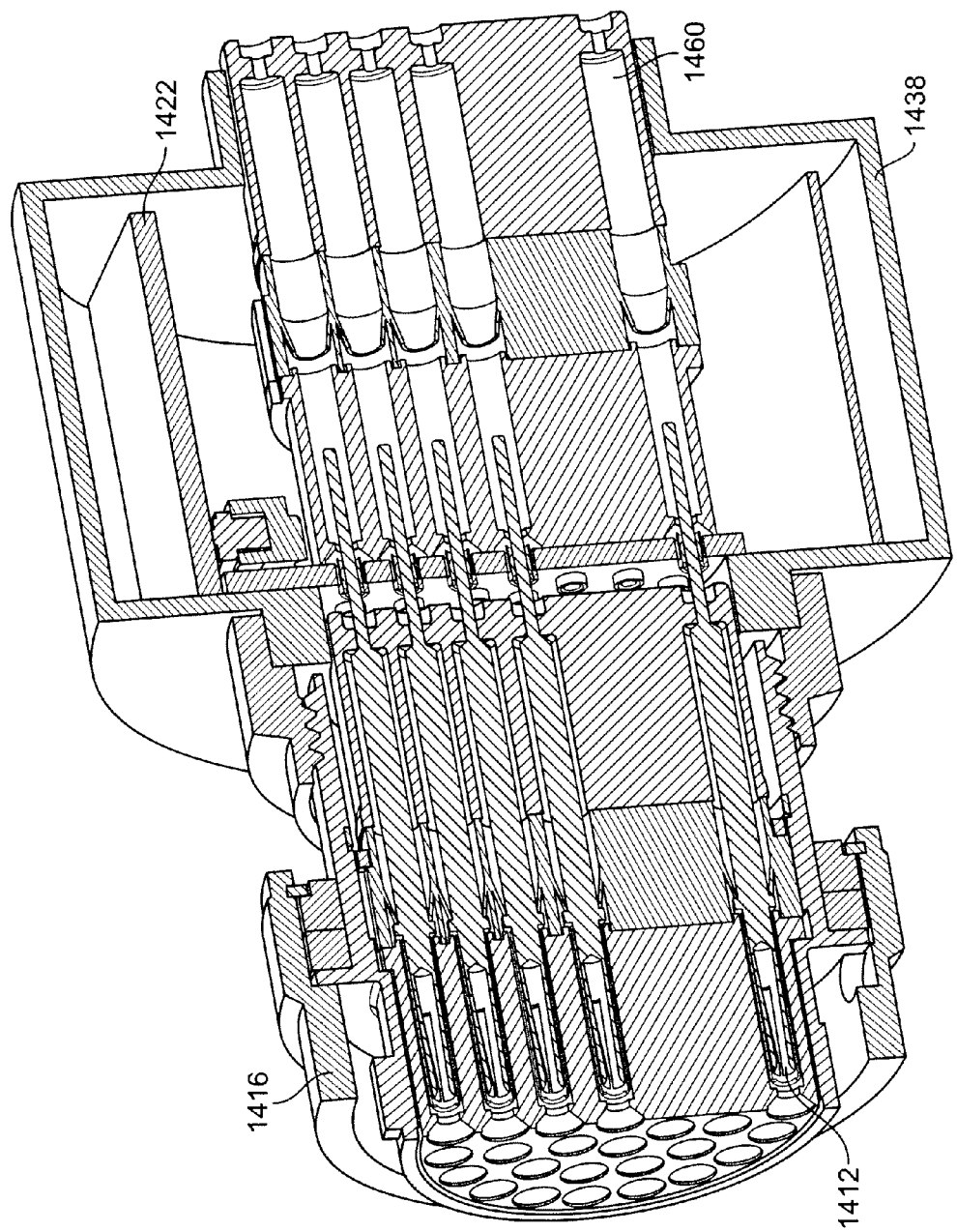
FIG. 14 illustrates a sensor connector in accordance with a seventh embodiment of the present invention.

A sensor connector in accordance with a seventh embodiment of the present invention is shown in FIG. 14. The connector illustrated in FIG. 14 is very similar to the one illustrated in FIG. 11. Both include a backshell 1138, 1438, a flexible circuit board 1122, 1422, and a socket 1160, 1460 that is connected to a pin contact 1112, 1412 and a wire 1150. Other than a few physical differences, these two connectors are functionally identical.

Figure 15:
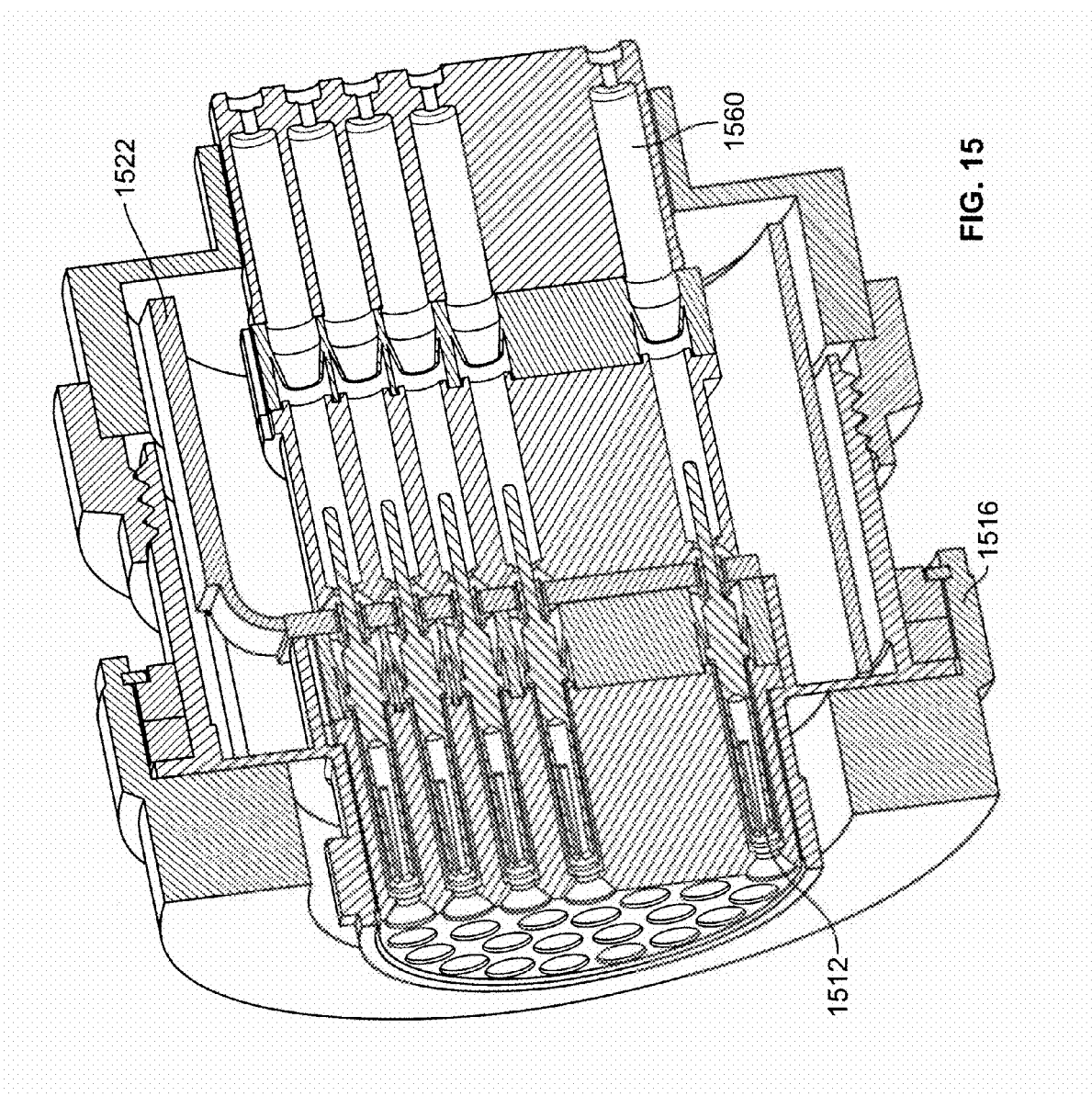
FIG. 15 illustrates a sensor connector in accordance with an eighth embodiment of the present invention.

A sensor connector in accordance with an eighth embodiment of the present invention is shown in FIG. 15. The primary difference between the connector illustrated in FIG. 15 and the one illustrated in FIG. 14 is that the sensor and circuit board are located inside the plug. Other than that, the connector in similar to the one illustrated in FIG. 14. Both include a socket 1460, 1560 and a flexible circuit board 1422, 1522, wherein the socket 1460, 1560 is connected to a pin contact 1412, 1512 and adapted to receive a wire (not shown). In both embodiments, a sensor (e.g., an inductive sensor, capacitive sensor, resistive sensor, etc.) (not shown) can be located on the circuit board 1422, 1522, and circuitry (not shown) can be included for processing, storing and/or transmitting the sensed information.

It should be appreciated that FIGS. 1 and 9-15 are not intended to limit the present invention, and are being provided to illustrate features that may be included in a sensor connector of the present invention. Those skilled in the art will appreciate that the features illustrated in FIGS. 1 and 9-15 can be combined (or mixed and matched) to produce a sensor connector for a particular purpose, that achieves a particular result. For example, a connector that includes (i) a rigid, flexible and/or rigid-flex circuit board, (ii) a MEMS, Hall Effect, inductive, capacitive and/or resistive sensor, (iii) circuitry for processing, storing and/or transmitting information, and/or (iii) a backshell, plug and/or receptacle, is within the spirit and scope of the present invention. This is true regardless of whether the sensor is located in an outer housing, a backshell, a plug or a receptacle, or whether the conductor is routed through the sensor (so that the conductor does not physically touch the sensor) or is physically connected to the sensor (e.g., via traces on a circuit board, etc.).

Figure 16:
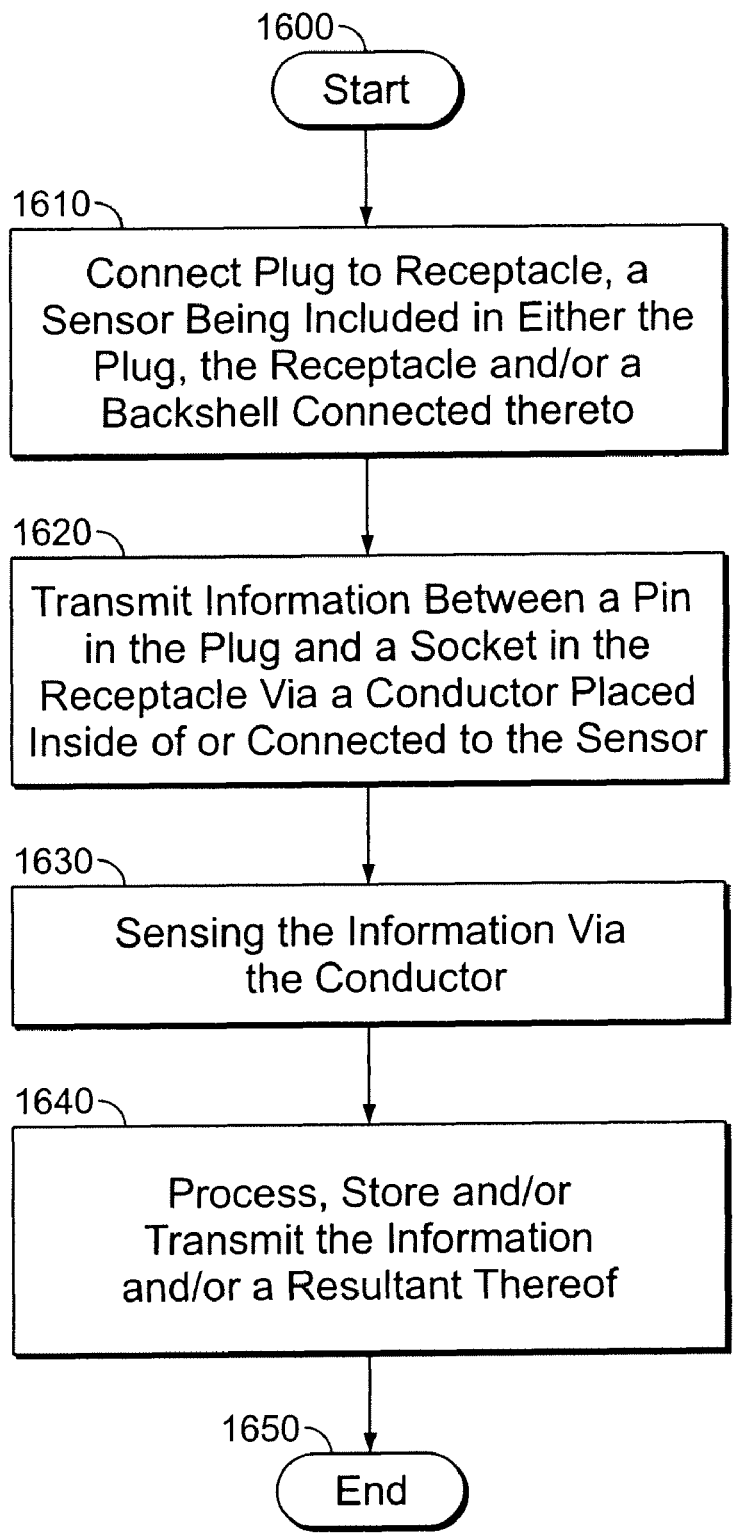
FIG. 16 illustrates a method of using a sensor connector (e.g., plug, receptacle, etc.) for sensing information that is being communicated over a conductor (e.g., pin contact, socket contact, wire, etc.) in accordance with another embodiment of the present invention.

FIG. 16 provides a method for using a sensor to sense (or sample) information that is being communicated over a conductor. Specifically, starting at step 1600, a commercial, consumer or military plug and receptacle are connected at step 1610, wherein a sensor is included in the plug, receptacle and/or backshell. Information is then communicated between a pin of the plug and a socket of the receptacle via a conductor that is placed inside or connected to the sensor at step 1620. At step 1630, the information that is being communicated over the conductor is then sensed (or sampled). It should be appreciated, however, that the sensed information may only be a portion of the information that is being communicated over the conductor. At step 1640, the sensed information is then processed, stored, and/or transmitted to an external device. For example, the information may be stored (e.g., in a memory) and/or processed (e.g., by a processor), and a resultant thereof (e.g., as processed) may be transmitted to an external device (e.g., via a wireless or wired communication port).

Figure 17:
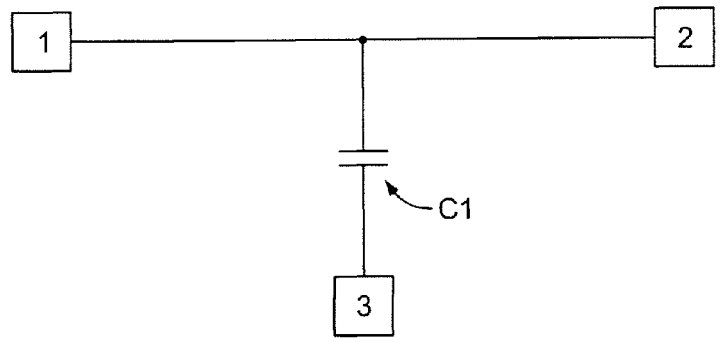
FIG. 17 is an exemplary circuit diagram for a capacitive sensor.

FIG. 17 provides an exemplary circuit diagram of a capacitive sensor, wherein the diagram includes a first port 1 at a first end of the conductor, a second port 2 at a second end of the conductor, and a third port 3 at an output of the sensor. For purposes of simulation, the resistance between ports 1 and 2 is 183 ohms, representing a 22 AWG wire 3 mm over a ground plane, the resistance at port 3 is 50 ohms, representing a resistor (not shown) connected between a metal tube (of the capacitor sensor) and the ground plane, and C1 is 1.56233 $e^{-13}$ F.

The capacitance of the metal tube around a 22 AWG wire with an insulator having a relative permittivity of 3800 can be calculated by the following formula, where $\epsilon_o$ is the permittivity of free space $8.854 \times 10^{-12}$ F/m, $\epsilon_r$ is the relative permittivity at 3800, b is the radius of the inside of the tube at 0.00125 m, a is the radius of the 22 AWG wire at 0.0003219 m, and l is the length of the tube at 0.00381 m:

$$C = \frac{2\pi\epsilon_o\epsilon_r l}{\ln\frac{b}{a}} = \frac{(2\pi)(8.854 \times 10^{-12})(3800)(0.00381)}{\ln\frac{.00125 \text{ m}}{.0003219 \text{ m}}} = 5.9369 \times 10^{-10} \text{ F}$$

Figure 18:
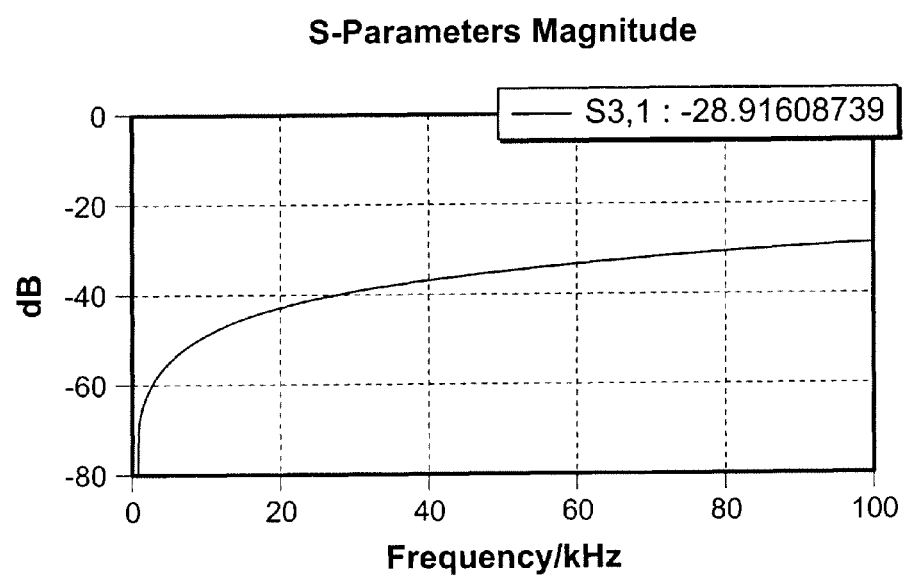
FIG. 18 provides simulation results of the circuit diagram provided in FIG. 17 over a frequency range of 0 Hz to 100 kHz.

Simulated results for FIG. 17, S3,1 are provided in FIG. 18. As shown therein, a power loss of 29 dB occurs at 100 kHz. As with FIG. 5, there is no power transmission at DC. While this type of sensor could be used to sense any signal, it would work especially well on signals with high frequency content.

Figure 19:
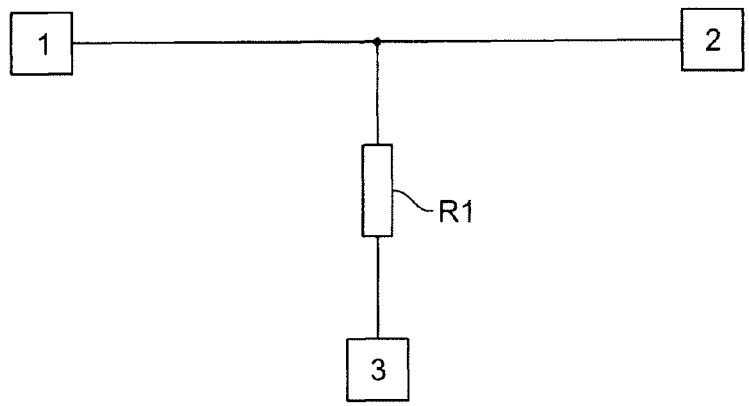
FIG. 19 is an exemplary circuit diagram for a resistive sensor.
Figure 20:
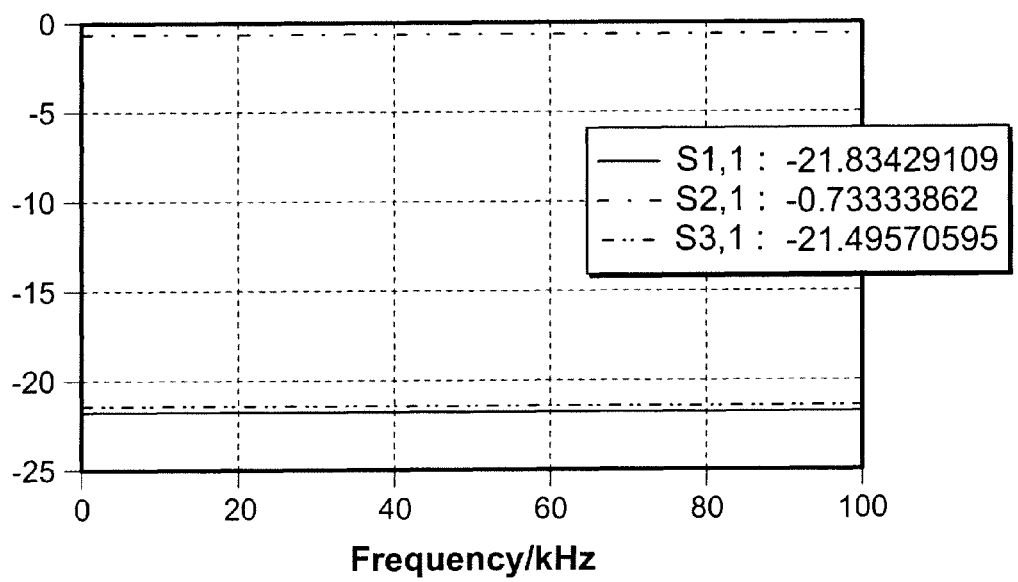
FIG. 20 provides simulation results of the circuit diagram provided in FIG. 19 over a frequency range of 0 Hz to 100 kHz.

FIG. 19 provides an exemplary circuit diagram of a resistive sensor, wherein the diagram includes a first port 1 at a first end of the conductor, a second port 2 at a second end of the conductor, and a third port 3 at an output of the sensor. For purposes of simulation, the resistance of R1 is 1000 ohms. Simulated results for FIGS. 19, S1,1, S2,1 and S3,1 are provided in FIG. 18. While this type of sensor could be use to sense any signal, it would work especially well on DC signals, AC signals, and power sources.

Having thus described several embodiments of a system and method for sensing information (e.g., voltage, current, data, etc.) that is being transmitted through a commercial, consumer or military connector, it should be apparent to those skilled in the art that certain advantages of the system and method have been achieved. It should also be appreciated that various modifications, adaptations, and alternative embodiments thereof may be made within the scope and spirit of the present invention. The invention is solely defined by the following claims.

What is claimed is:

1. A sensor connector, comprising:
    at least one shell adapted to be connected to at least one of a corresponding, external plug and a corresponding, external receptacle, said at least one shell comprising at least one conductor for transmitting information;
    at least one sensor for sensing said information from at least one conductor;
    at least one circuit in communication with said at least one sensor, said at least one circuit comprising at least one communication port for transmitting said information to at least one external device;
    a housing connected to said at least one shell and substantially surrounding said at least one sensor and said at least one circuit and
    a receptacle adapted to be connected to said corresponding, external plug;
    wherein said at least one shell further comprises a plug adapted to be connected to said corresponding, external receptacle, said at least one conductor further comprises at least one of at least one pin contact and at least one socket contact, and said housing being mounted between at least a portion of said plug and at least a portion of said receptacle.

2. A sensor connector, comprising:
    at least one shell adapted to be connected to at least one of a corresponding, external plug and a corresponding, external receptacle, said at least one shell comprising at least on conductor for transmitting information;
    at least one sensor for sensing said information from at least one conductor;
    at least one circuit in communication with said at least one sensor, said at least one circuit comprising at least one communication port for transmitting said information to at least one external device; and
    a housing connected to said at least one shell and substantially surrounding said at least one sensor and said at least one circuit;
    wherein said at least one sensor comprises a torroidal coil, including a core and at least one wire wrapped around said core.

3. The sensor connector of claim 1, further comprising at least one circuit board, wherein said at least one sensor comprises a MEMS sensor, said at least one circuit board includes said at least one sensor and said at least one circuit, and said at least one circuit board is substantially surrounded by said at least one housing.

4. The sensor connector of claim 1, further comprising at least one circuit board, wherein said at least one sensor comprises a Hall Effect sensor, said at least one circuit board includes said at least one sensor and said at least one circuit, and said at least one circuit board is substantially surrounded by said at least one housing.

5. The sensor connector of claim 1, further comprising at least one circuit board, wherein said at least one sensor comprises an inductive sensor, said at least one circuit board includes said at least one sensor and said at least one circuit, and said at least one circuit board is substantially surrounded by said at least one housing.

6. The sensor connector of claim 1, further comprising at least one circuit board, wherein said at least one sensor comprises a resistive sensor, said at least one circuit board includes said at least one sensor and said at least one circuit, and said at least one circuit board is substantially surrounded by said at least one housing.

7. The sensor connector of claim 1, wherein said at least one sensor comprises a capacitive sensor.

8. The sensor connector of claim 1, wherein said information comprises at least one of data, voltage, and current.

9. The sensor connector of claim 1, wherein said plug further comprises an outer shell, an inner shell, and a pin assembly, wherein said pin assembly is adapted to retain said at least one pin contact, said inner shell is adapted to retain said pin assembly, and said outer shell is adapted to retain said inner shell and to be connected to said corresponding, external receptacle.

10. The sensor connector of claim 1, wherein the receptacle further comprises a shell and a socket assembly, wherein said socket assembly is adapted to retain said at least one socket contact, and said shell is adapted to retain said socket assembly and to be connected to said corresponding, external plug.

11. A sensor connector, comprising:
    at least one shell adapted to be connected to at least one of a corresponding, external plug and a corresponding, external receptacle, said at least one shell comprising at least on conductor for transmitting information;
    at least one sensor for sensing said information from at least one conductor;
    at least one circuit in communication with said at least one sensor, said at least one circuit comprising at least one communication port for transmitting said information to at least one external device; and
    a housing connected to said at least one shell and substantially surrounding said at least one sensor and said at least one circuit;
    wherein said at least one circuit further comprises a memory device for storing said information prior to being transmitted via said communication port.

12. A sensor connector, comprising:
    at least one shell adapted to be connected to at least one of a corresponding, external plug and a corresponding, external receptacle, said at least one shell comprising at least on conductor for transmitting information;
    at least one sensor for sensing said information from at least one conductor;
    at least one circuit in communication with said at least one sensor, said at least one circuit comprising at least one communication port for transmitting said information to at least one external device; and
    a housing connected to said at least one shell and substantially surrounding said at least one sensor and said at least one circuit;
    wherein said at least one circuit further comprises a processor for processing said information prior to being transmitted via said communication port and a memory device for storing said information after said information has been processed, but prior to said information being transmitted via said communication port.

13. A sensor connector, comprising:
    at least one shell adapted to be connected to at least one of a corresponding, external plug and a corresponding, external receptacle, said at least one shell comprising at least on conductor for transmitting information;
    at least one sensor for sensing said information from at least one conductor;
    at least one circuit in communication with said at least one sensor, said at least one circuit comprising at least one communication port for transmitting said information to at least one external device;

a housing connected to said at least one shell and substantially surrounding said at least one sensor and said at least one circuit; and at least one circuit board, wherein said at least one circuit board includes said at least one circuit.

14. A sensor connector, comprising:

at least one shell adapted to be connected to at least one of a corresponding, external plug and a corresponding, external receptacle, said at least one shell comprising at least on conductor for transmitting information;

at least one sensor for sensing said information from at least one conductor;

at least one circuit in communication with said at least one sensor, said at least one circuit comprising at least one communication port for transmitting said information to at least one external device; and a housing connected to said at least one shell and substantially surrounding said at least one sensor and said at least one circuit;

wherein said housing comprises at least a first portion and a second portion, said first portion being separate from, and adapted to be connected to, said second portion.

15. A sensor connector, comprising:

at least one shell adapted to be connected to at least one of a corresponding, external plug and a corresponding, external receptacle, said at least one shell comprising at least on conductor for transmitting information;

at least one sensor for sensing said information from at least one conductor;

at least one circuit in communication with said at least one sensor, said at least one circuit comprising at least one communication port for transmitting said information to at least one external device; and a housing connected to said at least one shell and substantially surrounding said at least one sensor and said at least one circuit;

wherein said housing comprises a backshell, said backshell being connected to said at least one shell.

16. A sensor connector, comprising:

at least one shell adapted to be connected to at least one of a corresponding, external plug and a corresponding, external receptacle, said at least one shell comprising at least one conductor for transmitting information;

at least one circuit board;

at least one sensor on said at least one circuit board for sensing said information from said at least one conductor;

at least one circuit on said at least one circuit board in communication with said at least one sensor, said at least one circuit comprising at least one communication port for transmitting said information to at least one external device; and a housing connected to said at least one shell and substantially surrounding said at least circuit board, said at least one sensor and said at least one circuit.

17. The sensor connector of claim 16, wherein said at least one shell further comprises a plug portion configured for connecting to said corresponding, external receptacle, and a receptacle portion configured for connecting to said corresponding, external plug, said external housing being located between said plug portion and said receptacle portion.

18. The sensor connector of claim 16, wherein said at least one sensor comprises one of a Hall Effect sensor, a MEMS sensor, a capacitive sensor, a resistive sensor and a torroidal coil comprising a core and at least one wire.

19. The sensor connector of claim 16, wherein said information comprises at least one of data, voltage, and current.

20. The sensor connector of claim 16, wherein said at least one circuit further comprises a processor for processing said information.

21. The sensor connector of claim 16, wherein said at least one circuit further comprises a memory device for storing at least one of said information and said processed information.

22. The sensor connector of claim 16, wherein said housing comprises a backshell connected to said at least one shell.

23. An in-line sensor connector, comprising:

at least one shell adapted to be connected to a corresponding, external plug and a corresponding, external receptacle, said at least one shell comprising a plurality of conductors for transmitting information; and a plurality of sensors for sensing said information from said plurality of conductors;

a plurality of circuits for transmitting at least a portion of said information to at least one external device;

a plurality of inner housings; and an outer housing connected to said at least one shell, said outer housing substantially surrounding said plurality of sensors, said plurality of circuits, and said plurality of inner housings;

wherein each one of said plurality of inner housings is adapted to affix at least one of said plurality of sensors and is connected to a corresponding one of said plurality of circuits.

24. The in-line sensor connector of claim 23, wherein said plurality of sensors comprise a plurality of torroidal coils, each one of said plurality of torroidal coils including a core and at least one wire wrapped around said core.

25. The in-line sensor connector of claim 23, wherein said plurality of sensors comprises at least one sensor selected from a list of sensors consisting of a MEMS sensor, a Hall Effect sensor, an inductive sensor, a capacitive sensor and a resistive sensor.

* * * * *